United States Patent [19]

Bell

[11] 4,380,735
[45] Apr. 19, 1983

[54] COMPENSATING FEEDBACK SYSTEM FOR MULTI-SENSOR MAGNETOMETERS

[75] Inventor: Malcolm E. Bell, Medicine Hat, Canada

[73] Assignee: Her Majesty the Queen in right of Canada, as represented by the Minister of National Defence, Ottawa, Canada

[21] Appl. No.: 211,938

[22] Filed: Dec. 1, 1980

[30] Foreign Application Priority Data

Feb. 29, 1980 [CA] Canada ................................. 345355

[51] Int. Cl.³ .......................................... G01R 33/025
[52] U.S. Cl. ..................................... 324/244; 324/225
[58] Field of Search ...................... 324/225, 243–248, 324/253–255, 258, 260, 346; 33/355 R, 356, 357

[56] References Cited

U.S. PATENT DOCUMENTS

| | | | |
|---|---|---|---|
| 2,697,186 | 12/1954 | Anderson | 324/244 X |
| 2,802,983 | 8/1957 | Tolles | 324/244 X |
| 3,679,969 | 7/1972 | Fussell | 324/249 X |
| 4,229,697 | 10/1980 | Petrosky et al. | 324/345 X |

Primary Examiner—Gerard R. Strecker
Attorney, Agent, or Firm—Cushman, Darby & Cushman

[57] ABSTRACT

A magnetometer having two or more sensor feedback systems provides improved accuracy by compensating for the effect of the feedback field in each system on the other systems. Each system has a sensor for sensing a magnetic field, a feedback coil associated with the sensor for providing a feedback field at the latter, a feedback circuit for energizing the feedback coil in response to sensing of the magnetic field by the sensor and thereby producing at the sensor a feedback field for cancelling the sensed field at the sensor, a differential amplifier for deriving from the feedback circuit a first electrical signal proportional to the feedback field, resistors of predetermined resistances selected for modifying the first electrical signal to electrical signals which are each proportional to the feedback field at the sensor of a respective other one of the sensor feedback systems, and circuitry for combining the first electrical signal from each of the systems with one of the modified signals of each of the other of the systems to provide, from each of the systems, a respective output signal corresponding to the magnetic field sensed by that system.

4 Claims, 7 Drawing Figures

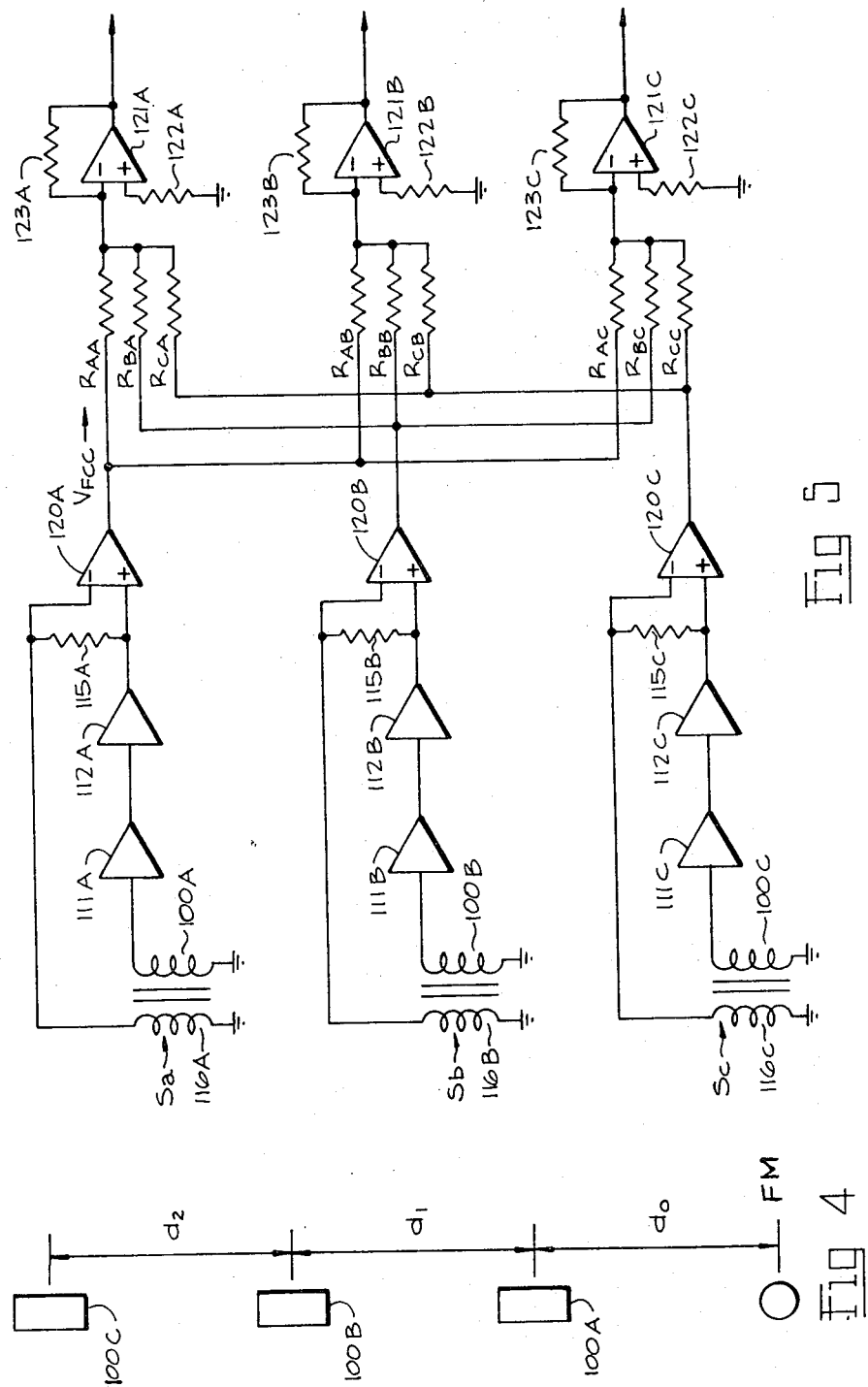

COMPENSATING FEEDBACK SYSTEM FOR MULTI-SENSOR MAGNETOMETERS

The present invention relates to magnetometers and, more particularly, is useful in gradiometers and multi-sensor magnetometers.

It is well known that the output voltage of an open loop magnetometer, i.e. a magnetometer having no feedback coil associated with a sensor coil thereof, is inherently non-linear and unstable with respect to a magnetic field being sensed and measured.

It has previously been proposed to reduce the non-linearity and instability of the magnetometer output voltage by providing a closed loop feedback system, in which a sensor coil is associated with a feedback coil and functions as a null detector.

However, in gradiometers and multi-sensor magnetometers, the use of a feedback coil associated with each sensor coil has the disadvantage that each feedback coil will provide a feedback magnetic field which will affect not only its own sensor coil but also the other sensor coils, and thus introduce a measurement error.

It is accordingly an object of the present invention to provide a novel and improved magnetometer having means for compensating for such feedback interference.

According to the present invention, there is provided a magnetometer having first and second sensor feedback systems each comprising sensor means for sensing a magnetic field; feedback coil means associated with said sensor means for providing a feedback field at the latter; feedback circuit means for energizing the feedback coil means in response to sensing of the magnetic field by the sensor means and thereby producing at the sensor means a feedback field for cancelling the sensed field at the sensor means; means for deriving from the feedback circuit means a first electrical signal proportional to the feedback field at the sensor means; and means for converting the first electrical signal to a second electrical signal corresponding to the feedback field of the feedback coil at the sensor means of the other one of the sensor feedback systems; and means for combining the first electrical signal of each of the systems with the second electrical signal of the other of the systems to provide two output signals proportional, respectively, to the sensed magnetic fields at the sensor means.

The invention will be more readily understood from the following description of prior art and of a preferred embodiments of the invention, given by way of example, with reference to the accompanying drawings, in which:

FIG. 4 shows a sensor coil array;

FIG. 5 shows a circuit diagram of a multi-sensor magnetometer embodying the present invention;

Figure 1:
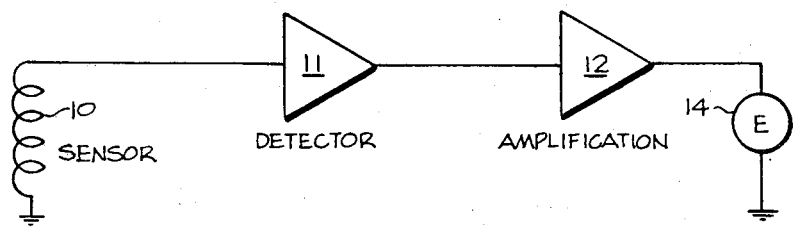
FIG. 1 shows a circuit diagram of a prior art open loop magnetometer.

The prior art open loop magnetometer illustrated in FIG. 1 has a magnetic field sensor coil 10 connected between ground and a detector 11. An amplifier 12 is connected between the output of the detector 11 and, through a voltmeter 14, to ground.

In operation of this magnetometer, a magnetic field which is to be measured is sensed by the sensor coil 10, and the current induced in the sensor coil 10 is detected by the detector 11 and amplified by the amplifier 12. The voltage at the output of the amplifier 12 is measured by the voltmeter 14 as a measure of the magnetic field sensed by the sensor coil 10.

As indicated hereinabove, such an open loop magnetometer provides a magnetic field measurement which is inherently non-linear and unstable with respect to the magnetic field being sensed by the sensor coil 10 and measured.

Figure 2:
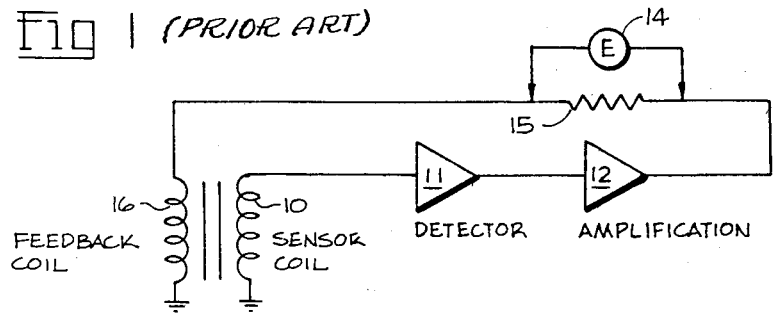
FIG. 2 shows a circuit diagram of a prior art closed loop magnetometer.

It has therefore previously been proposed to counteract such non-linearity and instability by use of a magnetometer, such as that illustrated in FIG. 2, employing a closed loop feedback system.

In this case, the sensor coil, the detector and the amplifier, which are indicated in FIG. 2 by the same reference numerals as employed in FIG. 1, are connected in series with a resistor 15 and a feedback coil 16, which is associated with the sensor coil 10 and grounded, as illustrated.

The voltmeter 14, as shown in FIG. 2, is employed for measuring the voltage across the resistor 15.

In operation of the prior arrangement, the output of the amplifier 12 is applied, through the resistor 15, to the coil 16, which consequently provides a feedback magnetic field. The sensor coil 10 now functions as a null detector, the magnetic field of the feedback coil cancelling the magnetic field sensed by the sensor coil 10.

The feedback current fed through the feedback coil 16 is proportional to the magnetic field nulled by the feedback coil 16 and is linear and considerably more stable than the output voltage of the open loop magnetometer illustrated in FIG. 1.

However, difficulties arise with the closed loop feedback system illustrated in FIG. 2 when it is embodied in a gradiometer or multi-sensor magnetometer employing two or more sensor coils.

Figure 3:
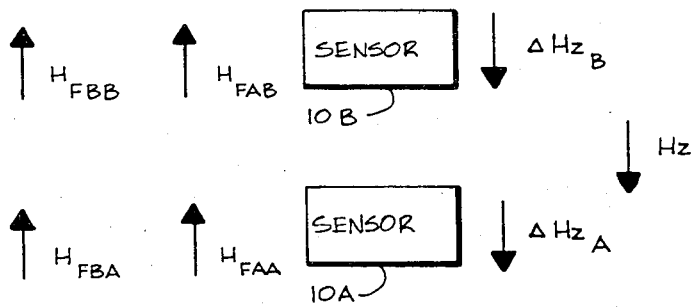
FIG. 3 shows a diagram illustrating the magnetic fields prevailing at a pair of sensors of a multi-sensor magnetometer.

Thus, referring to FIG. 3, when two sensor coils 10A and 10B are employed, the fields acting on these two coils 10A and 10B will be as represented by the arrows in FIG. 3, in which:

$Hz$ represents an ambient magnetic field;

$\Delta Hz_A$ represents an anomaly field at the sensor coil 10A;

$\Delta Hz_B$ represents an anomaly field at the sensor coil 10B;

$H_{FAA}$ represents the feedback field, of a feedback coil associated with the sensor coil 10A, at the sensor coil 10A;

$H_{FBA}$ represents the feedback field at the sensor coil 10A of the feedback coil associated with the sensor coil 10B;

$H_{FAB}$ represents the feedback field at the sensor coil 10B of the feedback coil associated with the sensor 10A; and $H_{FBB}$ represents the feedback field at the sensor coil B of the feedback coil associated with the sensor coil 10B.

As will be readily apparent to those skilled in the art, null detection by the sensor coils 10A and 10B will occur when:

$$Hz + \Delta Hz_A - H_{FAA} - H_{FBA} = 0 \text{ and}$$

$$Hz + \Delta H z_B - H_{FAB} - H_{FBB} = 0$$

This may be represented as:

$$(Hz + \Delta H z_A) - (Hz + \Delta H z_B) = (H_{FAA} + H_{FBA}) - (H_{FAB} + H_{FBB})$$

The feedback current in the sensor coil 10A is proportional to the ambient field if $H_{FBA} = H_{FAB}$. However, this only holds true when $\Delta H z_A = \Delta H z_B = 0$.

If an anomaly exists in the ambient field, i.e. $Hz_A$ is not equal to $Hz_B$ is not equal to zero, then the feedback current in the sensor coil 10A will no longer be proportional to the ambient field at the sensor coil 10A.

The same, of course, holds true for the sensor coil 10B.

Furthermore, it will be readily apparent that the closer the two sensor coils 10A and 10B are, the larger the measurement error will be.

FIG. 4 illustrates three sensor coils 100A, 100B and 100C sensing an anomaly field from ferrous material FM.

The sensor coil 100A is spaced by a distance D0 from the ferrous material FM, the sensor coil 100B is spaced by a distance D1 from the sensor coil 100A and the sensor coil 100C is spaced by a distance D2 from the sensor coil 100B.

In this case, at the sensor coil 100A, the ferrous material FM produces an anomaly field $\Delta H_A = M/d_0{}^3$.

The corresponding anomaly fields at the sensor coils 100B and 100C are:

$$\Delta H_B = \frac{M}{(d_0 + d_1)^3} \text{ and } \Delta H_C = \frac{M}{(d_0 + d_1 + d_2)^3}$$

Where M is the magnetic moment of the ferrous material FM.

In this case:

$$(Hz + \Delta H z_C) - (H_{FAC} + H_{FBC} + H_{FCC}) = 0$$

$$(Hz + \Delta H z_B) - (H_{FAB} + H_{FBB} + H_{FCB}) = 0$$

$$(Hz + \Delta H z_A) - (H_{FAA} + H_{FBA} + H_{FCA}) = 0$$

where $H_{FAC}$ is the feedback field at the sensor 100C of the feedback coil associated with the sensor coil 100A, $H_{FBC}$ is the feedback field at the sensor coil 100C of the feedback coil associated with the sensor coil 100B, etc.

Thus, by obtaining voltages proportional to the feedback fields of each of the feedback coils at each of the sensor coils, the sums of the ambient and anomaly fields can be determined.

This will be more readily apparent from a consideration of FIG. 5, in which there is shown a magnetometer having three closed loop feedback systems indicated generally by Sa, Sb and Sc, respectively.

Feedback system Sa incorporates the sensor coil 100A, a detector 111A and an amplifier 112A.

The output of the amplifier 112A is applied through a resistor 115A to a feedback coil 116A, associated with the sensor coil 100A, and a differential amplifier 120A is connected across the resistor 115A.

The systems Sb and Sc are similar to the system Sa and therefore the parts thereof have been indicated by the same reference numerals followed by the suffixes B and C, as appropriate.

The output of the differential amplifier 120A is connected to three resistors $R_{AA}$, $R_{AB}$ and $R_{AC}$, the output of the differential amplifier 120B is connected to three resistors $R_{BA}$, $R_{BB}$ and $R_{BC}$ and the output of the differential amplifier 120C is connected to three resistors $R_{CA}$, $R_{CB}$ and $R_{CC}$.

The three resistors $R_{AA}$, $R_{BA}$ and $R_{CA}$ are connected to one input of a differential amplifier 121A; the three resistors $R_{AB}$, $R_{BB}$ and $R_{CB}$ are connected to one input of the differential amplifier 121B and the three resistors $R_{AC}$, $R_{BC}$ and $R_{CC}$ are connected to one input of the differential amplifier 121C.

The other inputs of the differential amplifiers are grounded through respective resistors 122A, 122B and 122C.

Also, the differential amplifiers 121A, 121B and 121C have resistors 123A, 123B and 123C connected across them as shown.

Referring now to the feedback system Sa, it will be apparent that this system is similar to that disclosed in FIG. 2, except that the differential amplifier 120A replaces the voltmeter 14 of FIG. 2.

The voltage $V_{FCC}$ at the output of the differential amplifier 120A will be proportional to the feedback field $H_{FCC}$ of the feedback coil 116A.

This voltage is applied, as indicated above, to the resistors $R_{AA}$, $R_{AB}$ and $R_{AC}$, and these three resistors have values which are predetermined.

More particularly, the resistors $R_{AA}$, $R_{BB}$ and $R_{CC}$ each have the same resistance.

The resistor $R_{BA}$ has a resistance which reduces the output voltage of the differential amplifier 120B to a value corresponding to the feedback field of the feedback coil 116B of the feedback system Sb at the sensor coil 100A of the feedback system Sa.

Likewise, the resistor $R_{CA}$ has a value which reduces the output voltage of the differential amplifier 120C to a value corresponding to the feedback field of the feedback coil 116C of the feedback system Sc at the sensor coil 100A.

These resistance values can be determined by individually measuring the field intensity of the feedback coils 116B and 116C at the sensor coil 100A.

In this way, the output voltage of the differential amplifier 120A is compensated for these feedback field intensities from feedback coils 116B and 116C by summing amplifier 121A, and the output voltage of the latter represents an accurate measurement of the magnetic field sensed by the sensor coil 100A.

The output voltages of the differential amplifiers 120B and 120C are correspondingly compensated.

In this way, measurement errors resulting from feedback interference between the three feedback systems are corrected.

As will be apparent to those skilled in the art, the invention is not restricted to the use of coils for sensing the magnetic fields, but any other suitable magnetic field sensors may be employed.

Also, while the embodiments of the present invention shown in FIG. 5 employs electrical voltages as electrical signals representing the magnetic fields, other forms of circuitry could be utilized to provide, for example, electrical currents or a combination of voltages and currents as such signals.

Furthermore, the above described feedback compensation could alternatively be effected employing digital circuitry, other forms of analog circuitry, a combination of digital and analog circuitry or microprocessor logic.

The embodiment of the invention illustrated in FIG. 5 is suitable for use in situations in which the feedback field from one of the sensor coils is opposing the ambient field at another of the sensor coils. In this case, the sensitive axes of the sensor coils are vertical and the sensor coil array is also vertical.

Figure 6:
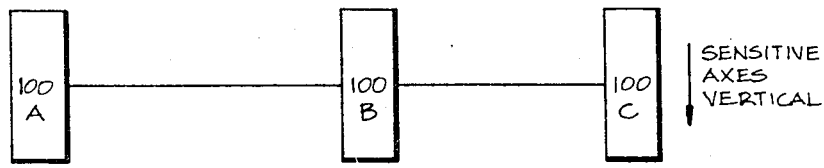
FIG. 6 shows a sensor coil array.
Figure 7:
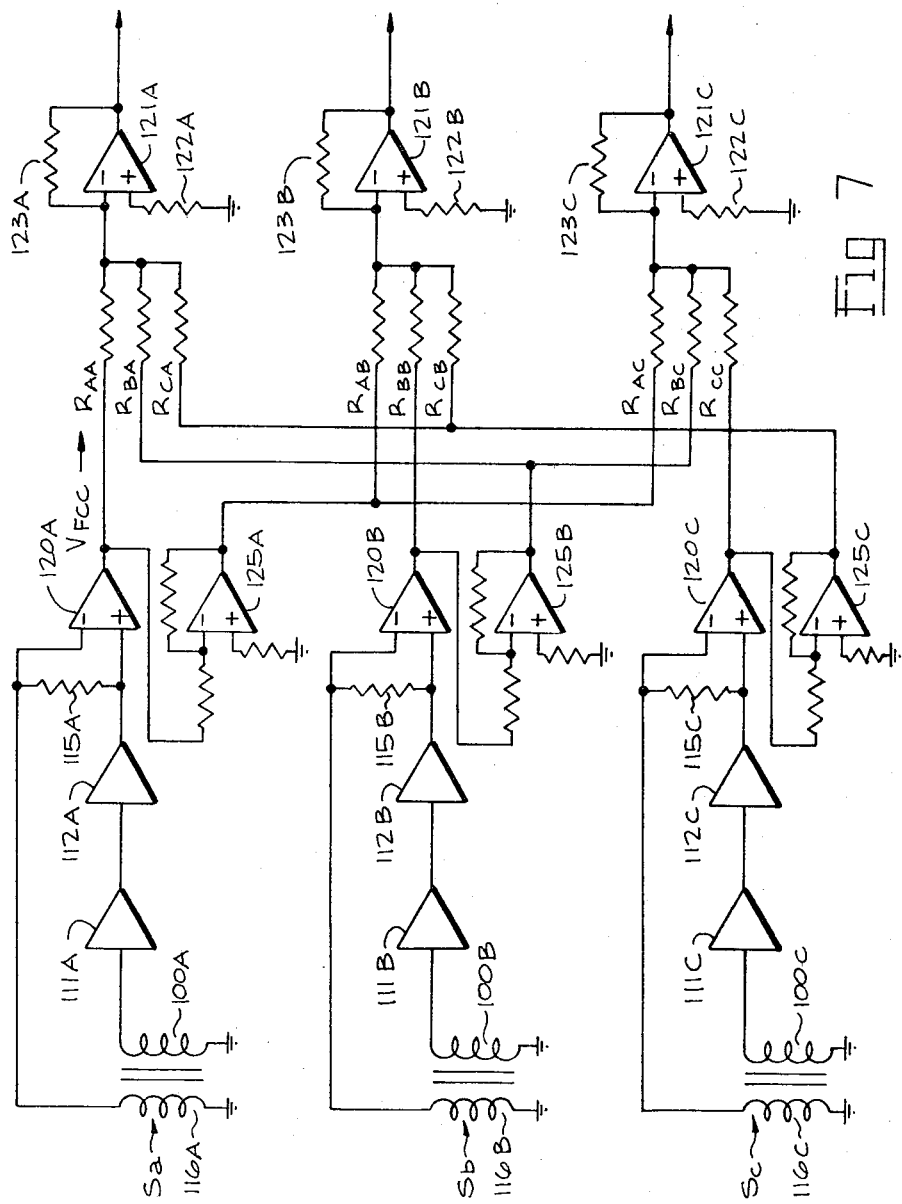
FIG. 7 shows a modification of the circuit diagram of FIG. 5.

However, if the feedback coil associated with one of the sensor coils is aiding the ambient field at another of the sensor coils, as would be the case if the sensitive axes of the sensor coils were vertical and the sensor array were horizontal, as illustrated in FIG. 6, then the circuitry shown in FIG. 5 may be modified as shown in FIG. 7.

As can be seen in FIG. 7, there is in this case inserted, between each operational amplifier 120A, 120B and 120C and the pairs of resistors $R_{AB}$, $R_{AC}$; $R_{BA}$, $R_{BC}$; and $R_{CA}$, $R_{CB}$, respectively, a respective inverting operational amplifier 125A, 125B or 125C.

Referring again to FIG. 5, it was mentioned hereinbefore that the resistances of resistors $R_{BA}$ and $R_{CA}$ can be determined by individually measuring the field intensity of the feedback coils 116B and 116C at the sensor coil 100A.

More particularly, this determination can be effected by the following sequence of steps:

Firstly, the sensor coils are mechanically aligned so that their magnetic axes are parallel, and all of the sensor coils are placed in a zero gradient magnetic field of known value. This will be referred to hereinafter as the reference magnetic field.

Feedback systems Sb and Sc are disconnected so that no current flows through either of these coils, and the value of resistor 115A is adjusted to obtain a voltage of 0 V at the output of amplifier 112A. Feedback system Sb is then reconnected and feedback system Sa is disconnected so that no current flows through systems Sa and Sc. The value of resistor 115B is adjusted to obtain a voltage of 0 V at the output of amplifier 112B.

Feedback system Sc is then reconnected and feedback system Sb is disconnected so that no current flows through coils Sa or Sb.

Resistor 115C is adjusted to obtain a voltage of 0 V at the output of amplifier 112C.

As mentioned above, $R_{AA}=R_{BB}=R_{CC}$ and selection of these resistors can be made using standard operational amplifier design theory, a value between 1 kΩ and 100 kΩ, in most cases, being suitable.

$R_{BA}$ and $R_{BC}$ are disconnected from amplifier 120B, $R_{CA}$ and $R_{CB}$ from 120C, and $R_{AB}$ and $R_{AC}$ from 120A, and the input side of these resistors is connected to ground.

Feedback system Sa is connected and feedback systems Sb and Sc are disconnected so that no current flows through feedback system Sb or Sc.

R123A is selected so that the maximum magnetic field value to be measured does not saturate operational amplifier 121A.

The voltage output of operational amplifier 121A for the applied reference magnetic field at sensor system 100A is measured and recorded and is referred to hereinafter as the reference output voltage.

Feedback coil Sb is then connected and feedback system Sa is disconnected so that no current flows through feedback coil Sa or Sc.

The reference magnetic field is applied to sensor coil 100B and the value of 123B is adjusted to obtain the reference output voltage at the output of amplifier 121B.

In a corresponding manner, the reference output voltage is then obtained at the output of amplifier 121C by adjustment of resistor 123C and resistors $R_{BA}$, $R_{CA}$, $R_{AB}$, $R_{CB}$, $R_{AC}$ and no current flows through systems Sa or Sb.

$R_{AC}$ are likewise correspondingly adjusted to obtain the reference voltage at the outputs of amplifiers 121A, 121B and 121C in an analogous manner. Specifically, connect feedback systems Sa and Sb, disconnect feedback system Sc, and connect the input side of Rba to the output of 120B. Adjust the value of Rba to obtain the reference output voltage at the 121A output. Connect Sc, connect the input side of Rca to the output of 120C, and adjust Rca to obtain the reference output voltage at the output of 121A. Disconnect system Sc, connect the input side of Rab to the output of 120A. Adjust Rab to obtain the reference output voltage at the output of 121B. Connect system Sc, connect the input side of Rcb to the output of 120C. Adjust Rcb to obtain the reference output voltage at the output of 121B. Disconnect system Sb, connect the input side of Rac to the output of 120A, and adjust Rac to obtain the reference output voltage at the output of 121C. Connect system Sb, connect the input side of Rbc to the output of 120B, and adjust Rbc to obtain the reference output voltage at the output of 121C.

The following resistance relationships then apply:

$$122A = \frac{(R_{AA})(R_{BA})(R_{CA})(123A)}{R_{AA} + R_{BA} + R_{CA} + 123A};$$

$$122B = \frac{(R_{AB})(R_{BB})(R_{CB})(123B)}{R_{AB} + R_{BB} + R_{CB} + 123B}; \text{ and}$$

$$122C = \frac{(R_{AC})(R_{BC})(R_{CC})(123C)}{R_{AC} + R_{BC} + R_{CC} + 123C}$$

The embodiments of the invention in which an exclusive property or privilege is claimed are defined as follows:

1. A magnetometer having first and second sensor feedback systems each comprising:
   sensor means for sensing a magnetic field;
   feedback coil means associated with said sensor means for providing a feedback field at the latter;
   feedback circuit means for energizing said feedback coil means in response to sensing of the magnetic field by said sensor means and thereby producing at said sensor means a feedback field for cancelling the sensed field at said sensor means;
   means for deriving from said feedback circuit means a first electrical signal proportional to the feedback field at said sensor means; and
   means for converting said first electrical signal to a second electrical signal proportional to said feedback field of said feedback coil at the sensor means of the other one of said sensor feedback systems; and
   means for combining the first electrical signal of each of said systems with the second electrical signal of the other of said systems to provide two output signals corresponding, respectively, to the sensed magnetic fields at said sensor means.

2. A magnetometer as claimed in claim 1, wherein said first converting means comprise a resistor having a predetermined resistance selected to effect the conversion of said first electrical signal to said second electrical signal.

3. A multi-sensor magnetometer having a plurality of sensor feedback systems each comprising:
   sensor means for sensing a magnetic field;
   feedback coil means associated with said sensor means for providing a feedback field at the latter;
   feedback circuit means for energizing said feedback coil means in response to sensing of the magnetic field by said sensor means and thereby producing at said sensor means a feedback field for cancelling the sensed field at said sensor means;
   means for deriving from said feedback circuit means a first electrical signal proportional to the feedback field at said sensor means; and
   means for converting said first electrical signals to modified signals each proportional to said feedback field of said feedback coil at the sensor means of a respective other one of said sensor feedback systems; and
   means for combining the first electrical signal of each of said systems with one of the modified electrical signals of each of the other of said systems to provide, from each of said systems, a respective output signal corresponding to the magnetic field sensed by said system.

4. A magnetometer as claimed in claim 3, wherein said first converting means comprise a resistor having a predetermined resistance selected to effect the conversion of said first electrical signal to said second electrical signal.

* * * * *